(12) United States Patent
Marion et al.

(10) Patent No.: US 9,793,141 B2
(45) Date of Patent: Oct. 17, 2017

(54) HYBRID ELECTRONIC DEVICE PROTECTED AGAINST HUMIDITY AND METHOD OF PROTECTING A HYBRID ELECTRONIC DEVICE AGAINST HUMIDITY

(71) Applicants: COMMISSARIAT A L'ENERGIE ATOMIQUE ET AUX ENERGIES ALTERNATIVES, Paris (FR); Thales, Courbevoie (FR)

(72) Inventors: Francois Marion, Saint Martin le Vinoux (FR); Tony Maindron, Grenoble (FR)

(73) Assignees: Commissariat A L'Energie Atomique Et Aux Energies Alternatives (FR); Thales (FR)

( * ) Notice: Subject to any disclaimer, the term of this patent is extended or adjusted under 35 U.S.C. 154(b) by 0 days.

(21) Appl. No.: 15/419,576

(22) Filed: Jan. 30, 2017

(65) Prior Publication Data
US 2017/0229321 A1   Aug. 10, 2017

(30) Foreign Application Priority Data
Feb. 4, 2016  (FR) ..................... 16 50873

(51) Int. Cl.
*H01L 23/48*   (2006.01)
*H01L 21/56*   (2006.01)
(Continued)

(52) U.S. Cl.
CPC .......... *H01L 21/563* (2013.01); *H01L 23/291* (2013.01); *H01L 23/3185* (2013.01);
(Continued)

(58) Field of Classification Search
CPC ................ H01L 21/563; H01L 23/291; H01L 23/3185; H01L 25/0657; H01L 25/50; H01L 2225/06513
(Continued)

(56) References Cited

U.S. PATENT DOCUMENTS 7,816,710 B2 * 10/2010 Palmateer ............ G02B 26/001
257/257
7,972,669 B2 * 7/2011 Matsuoka .............. C08J 9/0061
428/304.4
(Continued)

FOREIGN PATENT DOCUMENTS

EP       2476784 A1    7/2012

OTHER PUBLICATIONS

Chung, Diana. "Underfill Material Selection for Flip Chip Technology". Massachusetts Institute of Technology, Jun. 1998.
(Continued)

*Primary Examiner* — Tu-Tu Ho
(74) *Attorney, Agent, or Firm* — St. Onge Steward Johnston & Reens, LLC

(57) ABSTRACT

This method concerns the protection against humidity of a device including a first and a second electronic components respectively having two opposite surfaces, the surfaces: being separated by a non-zero distance shorter than 10 micrometers; having an area greater than 100 mm$^2$; being connected by an assembly of electrical interconnection elements spaced apart from one another by a space void of matter. This method includes applying a deposit of thin atomic layers onto the device to form a layer of mineral material covering at least the interconnection elements, the layer of mineral material having a permeability to water vapor smaller than or equal to $10^{-3}$ g/m$^2$/day.

9 Claims, 3 Drawing Sheets

(51) Int. Cl.
  *H01L 25/00* (2006.01)
  *H01L 25/065* (2006.01)
  *H01L 23/31* (2006.01)
  *H01L 23/29* (2006.01)
(52) U.S. Cl.
  CPC .......... *H01L 25/0657* (2013.01); *H01L 25/50* (2013.01); *H01L 2225/06513* (2013.01)
(58) Field of Classification Search
  USPC ........................................................ 257/777
  See application file for complete search history.

(56) References Cited

U.S. PATENT DOCUMENTS

| 2005/0103264 A1 | 5/2005 | Jansen |
| 2009/0001487 A1 | 1/2009 | Mizuno et al. |
| 2009/0065932 A1 | 3/2009 | Sane et al. |
| 2016/0020160 A1 | 1/2016 | Buvid et al. |

OTHER PUBLICATIONS

Maindron, et al. 2013 "Investigation of Al2O3 barrier film properties made by atomic layer deposition onto fluroescents tris-(8-hydroxyquinoline) aluminium molecular films", Thin Solid Films 548, 517-525.

Wong, et al. "Characterization of a No-Flow Underfill Encapsulant During the Solder Reflow Process". Georgia Institute of Technology, Atlanta GA, 1998.

* cited by examiner (State of the art)

(State of the art)

(State of the art)

(State of the art)

(State of the art)

HYBRID ELECTRONIC DEVICE PROTECTED AGAINST HUMIDITY AND METHOD OF PROTECTING A HYBRID ELECTRONIC DEVICE AGAINST HUMIDITY

FIELD OF THE INVENTION

The present invention relates to the improvement of the reliability of connections between two assembled components.

The invention more particularly finds an application in the assembly of two electronic components according to the so-called "flip-chip" technique, which forms vertical interconnects between the two components. The invention thus finds a specific application in so-called "chip-on-chip", "chip-on-wafer", and "wafer-on-wafer" assemblies.

The invention advantageously applies to devices requiring interconnects for metal patterns having a very small pitch, particularly for the manufacturing of imagers of very large dimensions and with a very small pitch, such as for example large heterogeneous detection arrays comprising a large number of connections, cold-hybridized temperature-sensitive detection arrays, or also detection arrays sensitive to mechanical stress. The invention also advantageously applies to so-called "3D" structures, which comprise a stack of circuits made of different materials and accordingly sensitive to thermal stress. The invention also particularly applies to high-sensitivity detectors capable of detecting a small number of photons, particularly a single photon.

The invention also applies to the cold hybridization of components.

BACKGROUND OF THE INVENTION

The assembly of two electronic components by the so-called "flip-chip" technique, for example, by thermocompression, usually comprises forming electrically-conductive solder balls on a surface of a first electronic component and on a surface of a second component according to a predetermined connection pattern. The first component is then arranged on the second component to align their respective solder balls, after which the assembly is pressed and heated. The balls placed into contact then deform and melt to form electrical interconnects perpendicular to the main plane of the electronic components, generally in the form of a slice.

A device comprising two electronic components separated by a distance in the range from 1 micrometer to 10 micrometers, having a mutually facing area greater than 100 mm$^2$ (for example, two square surfaces with a 10-millimeter side length facing each other), is thus generally obtained. Usually, the surface density of interconnects is in the range from $10^{10}/m^2$ and $10^{12}/m^2$.

A problem with this type of assembly is that the vertical interconnects obtained by the hybridization are sensitive to thermal stress, and this, all the more as the first and second components are made of different materials. Indeed, the components most often have different thermal expansion coefficients, so that under the effect of a temperature variations, the interconnects are submitted to a shearing which embrittles them and breaks them.

To increase the thermo-mechanical reliability of a hybridized assembly and to provide a protection of interconnects against the environment, it is generally provided to fill the space separating the two components with a resin layer known as "underfill", the action of filling this space being known as "underfilling". The shearing forces are thus distributed all over the layer separating the two hybridized components, and no longer on interconnects only, the latter being thus efficiently protected. It is then spoken of an "encapsulated flip-chip". Reference may for example be made to document "Underfill material selection for flip chip technology" of Diana C. Chiang, Thesis (S.M.), Massachusetts Institute of Technology, Dept. of Materials Science and Engineering, 1998.

Two techniques for filling the volume separating the two components hybridized with solder balls are known: the first one is known as "fast flow", and the second one is known as "no-flow". Such techniques are for example described in document "*Characterization of a No-Flow Underfill Encapsulant During the Solder Reflow Process*", of C. P. Wong et al., Proceedings of the Electronic Components and Technology Conference, 1998, pages 1253-1259.

A "flip-chip" assembly followed by an underfill according to the "fast flow" technique is now described in relation with FIGS. 1 to 4.

In a first step (FIG. 1), a first electronic component 10a provided with solder balls 12a on one of its surfaces 14a, is aligned with a second electronic component 10b, also provided with solder balls 12b on one of its surfaces 14b. A pressure is then exerted on the second component as indicated by the illustrated arrows by further raising the temperature of the assembly to a temperature higher than or equal to the melting temperature of the metal forming balls 12a, 12b. Balls 12a, 12b then bond to one another by thermocompression to form interconnects 16 (FIG. 2). During a next step (FIG. 3) usually following the application of a deoxidation flow to clean interconnects 16, an electrically-insulating liquid resin 18 is deposited by means of a dispenser 20 on surface 14a of first component 10a. Resin 18 then migrates by capillarity into volume 20 separating the opposite areas of parallel surfaces 14a, 14b and ends up totally filling this volume 20, thus embedding electrical interconnects 16 (FIG. 4). Resin 18 is then solidified, usually by application of a thermal treatment, or "curing". A last step of connecting the hybridized device to outer elements (not shown) is then implemented (FIG. 5), for example, by connecting connection areas 22, provided for this purpose on first component 10a, with wires 24 (so-called "wire bonding" connections).

As known per se, the resin is a mixture of glue as a main component, for example, epoxy glue, and of a solvent which enables to adjust the viscosity of the resin and which is evaporated during the thermal treatment of the resin. The mixture may also comprise hardening agents, particularly polymerizing agents, for example, a catalyst, a photoinitiator or a thermal initiator, and/or surface agents, for example, silane, which increases the bonding and the wettability of the resin on the surfaces of the components with which it enters into contact, and/or particles for adjusting the thermal expansion coefficient of the resin, usually called "fillers".

The first problem posed by the "encapsulated flip chip" technique is that of the presence of a polymer in the filling resin. Now, polymers are by nature "non tight", that is, they cannot form on the long term a barrier against humidity. Further, their efficiency against humidity strongly decreases when the device is submitted to significant thermal excursions. More particularly, a corrosion of interconnects 16 in the presence of the adsorbed humidity can be observed. Indeed, interconnects are generally formed of a complex stack of metallic materials (solders, intermetallic, bonding metals, solder diffusion barrier metals, etc.) whereby such structures have chemical potentials favoring an accelerated corrosion in the presence of humidity.

Further, humidity implies the swelling of the encapsulation resins after humidity has been absorbed, which induces mechanical stress tending to separate the components and resulting in prematurely breaking interconnects 16.

Thus, the encapsulation material of the state of the art alone does not provide a good resistance to climatic stress.

SUMMARY OF THE INVENTION

The present invention aims at providing an increased resistance to humidity of interconnects connecting two components placed on each other, particularly in the context of a "flip-chip"-type hybridization.

For this purpose, the invention aims at a method of protecting against humidity a device comprising a first and a second electronic components respectively having two opposite surfaces, said surfaces:

being separated by a non-zero distance shorter than 10 micrometers;

having an area greater than 100 mm$^2$; and being connected by an assembly of electrical interconnection elements spaced apart from one another by a space void of matter.

According to the invention, the method comprises applying a deposit of thin atomic layers onto the device to form a layer of mineral material covering at least said interconnection elements, the layer of mineral material having a water-vapor permeability smaller than or equal to $10^{-3}$ g/m$^2$/day.

Mineral material means in the sense of the invention mineral or ceramic materials having ionic bonds or covalent bonds, particularly inorganic materials characterized by their mechanical and thermal resistance (for example, refractory materials) and their good quality as a water vapor barrier. Among mineral materials used as waterproofing electrical interconnects, dielectric oxides and/or nitrides, particularly those having formulas $TiO_2$, $ZrO_2$, $SiO_x$, $SiN_x$, $SiO_xN_y$, ZnSe, ZnO, $Sb_2O_3$, aluminum oxides (for example, $Al_2O_3$), and transparent conductive oxides (or "TCO", for example, indium-tin oxide ("ITO") or aluminum zinc oxide ("AZO")) can be mentioned.

In other words, the invention comprises waterproofing the interconnects of two components, for example, assembled according to a "flip-chip" technique, such a waterproofing occurring after the hybridization but before the encapsulation with resin. The surface of the interconnects is thus covered with a mineral material and accordingly a material which both cannot be corroded in water and forms an efficient water barrier. Further, the waterproofing material has a strong adherence to metals. Finally, since the interconnects are not corroded, they thus have a better resistance to the resin swelling induced by humidity.

It is further considered that conventional vapor phase deposition techniques (for example, PVD, CVD, but also ALD) are not adapted to encapsulate interconnects which are located in a volume having a very large aspect ratio. Indeed, interconnects have such a high surface density that there exists no "direct" path from the edge of the hybridized device, that is, the entry point of vapor into the volume between the two components, and the interconnects housed at the heart of the device. Particularly, for each of these interconnects, there exists a multitude of interconnects which mask it from the vapor phase. It should besides be noted that the underfill is always performed in liquid phase, using capillarity to progress between the two components. In particular, it has not been provided in the state of the art to use vapor deposition techniques for the underfill, even though such techniques are capable of depositing thicknesses of material of a few tens of micrometers and thus thicknesses much larger than the usual distance between the two hybridized components (from 1 μm to 10 μm). This means, in particular, that the volume between the two components crossed by a multitude of interconnects is considered to be only accessible by capillarity, vapor phase depositions being on the contrary used to deposit or fill cavities void of any matter which provide direct paths to their walls for the vapor phase.

Now, the inventors have succeeded in depositing a layer of mineral material on interconnects housed in a volume having an aspect ratio greater than or equal to $10^3$ (this value for example corresponding to opposite surfaces which are square with a 10-millimeter side length and which are spaced apart by 10 micrometers) with interconnect surface densities greater than $10^{10}$/m$^2$.

According to a specific embodiment, the layer of mineral material has a thickness in the range from 10 nanometers to 100 nanometers, in particular for a mineral material made of alumina ($Al_2O_3$). A 10-nanometer thickness allows a good waterproofing of the interconnects. It can further be observed that beyond 100 nanometers, no significant gain in terms of waterproofing is obtained.

According to an embodiment:

the application of the deposit of thin atomic layers comprises placing the structure in a chamber and injecting into said chamber reactant gases for the forming of the layer of mineral material;

and the injection of the reactant gases is carried out without pumping in the chamber.

In other words, during the deposition, the chamber is not crossed by a continuous flow of the precursors used by the ALD, as is conventionally the case for an ALD. Indeed, in this conventional pumping operating mode, the species may not have time to diffuse everywhere into the asperities created by the volume between components and the interconnects. There may further exist gas flows disturbed by such asperities (generation of vortices, for example), giving birth to a non-homogeneous deposited layer, or even to non-covered portions. By stopping the pumping, the species thus have time to diffuse without causing a gas disturbance.

According to an embodiment, the method comprises depositing a filling material totally filling the space void of matter separating the opposite surfaces of the two components, the deposition of the filling material being carried out after the deposition of the layer of mineral material on the interconnection elements.

The invention also aims at a device comprises a first and a second electronic components respectively having two opposite surfaces, said surfaces:

being separated by a non-zero distance shorter than 10 micrometers;

having an area greater than 100 mm$^2$;

being connected by a set of different electrical interconnection elements.

According to the invention, the device comprises a layer of mineral material at least covering said interconnection elements, the layer of mineral material having a permeability to water vapor lower than or equal to $10^{-3}$ g/m$^2$/day.

Such a device is much more reliable against the corrosion of these interconnects and thus has an increased lifetime.

According to an embodiment, the mineral material is selected from the group comprising the compounds having formula SiOx, $SiN_x$, $SiO_xN_y$, ZnSe, ZnO, $Sb_2O_3$, aluminum oxides, and transparent conductive oxides (TCO).

According to an embodiment, the layer of mineral material has a thickness in the range from 10 to 100 nanometers.

According to an embodiment, the device comprises a filling material totally filling the space separating the opposite surfaces of the two components.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE INVENTION

Figure 1:
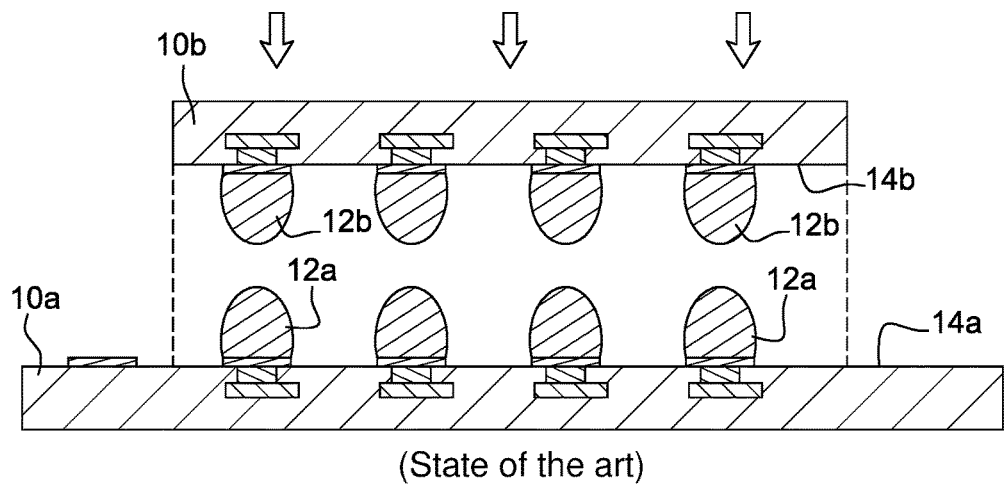
FIGS. 1 to 5 are simplified cross-section views illustrating a method of manufacturing a hybridized device with a "flip-chip" technique according to the state of the art, such as discussed hereabove.
Figure 2:
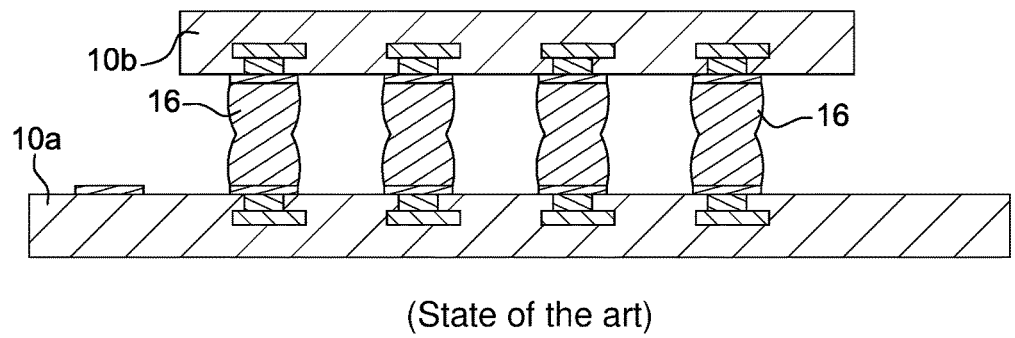
Figure 6:
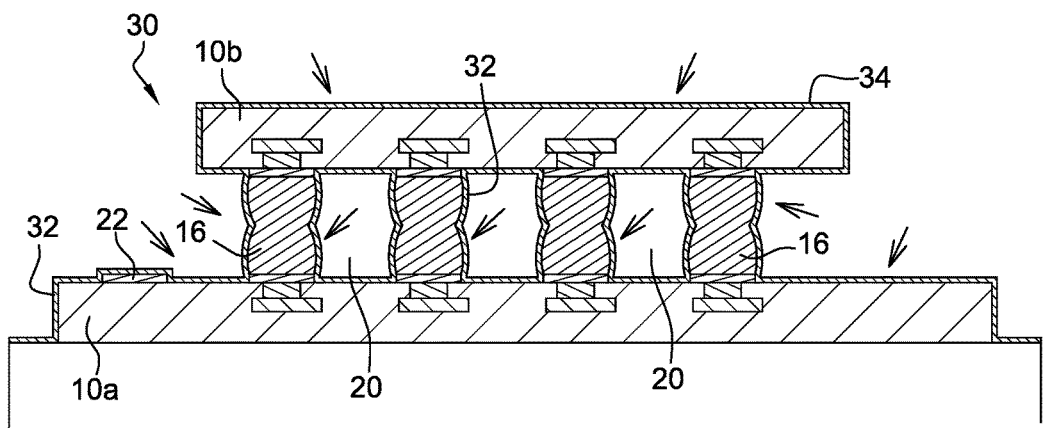
FIGS. 6 to 8 are simplified cross-section views illustrating a method of manufacturing a hybridized device with a "flip-chip" technique according to the invention, comprising a step of waterproofing the electrical interconnects.
Figure 7:
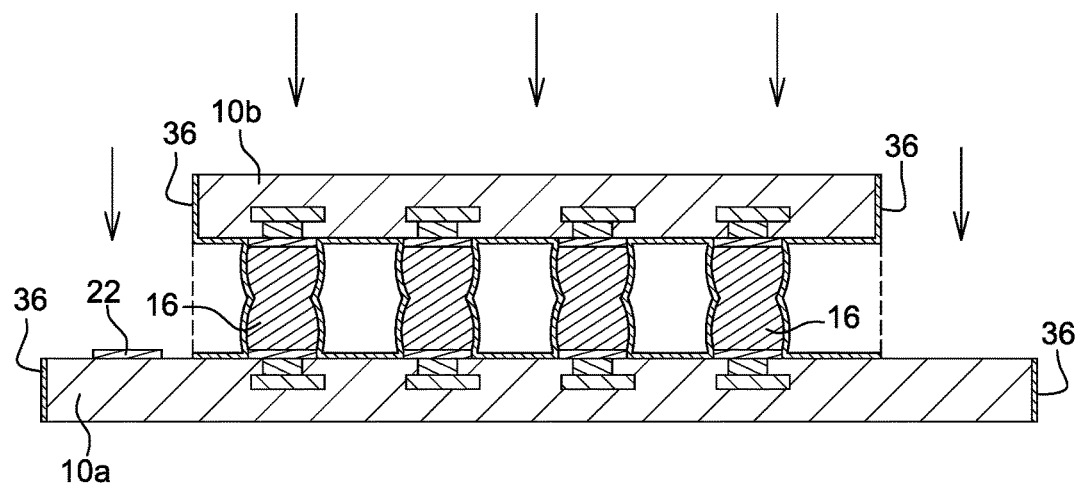
Figure 8:
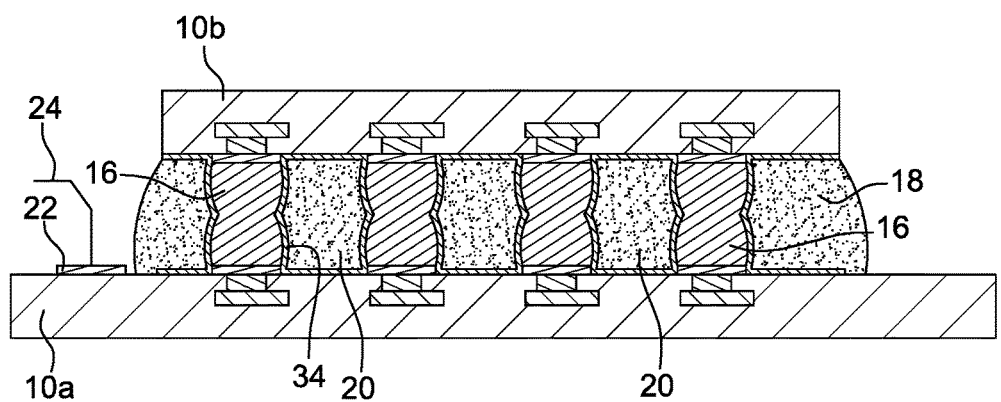

Referring to FIGS. 6 to 8, a method of manufacturing a device 30 comprising two hybridized electronic components 10a, 10b, comprising electrical interconnects 16, starts similarly to the state of the art, as for example described in relation with FIGS. 1 and 2. This device comprises two electronic components, for example, separated by a distance in the range from 1 micrometer to 10 micrometers, having a mutually facing area larger than 100 mm$^2$ (for example, two square surfaces having a 10-millimeter side length opposite each other), and having a surface density of interconnects in the range from $10^{10}/m^2$ to $10^{12}/m^2$.

Once the hybridization is finished and before applying an encapsulation material 18, a step of waterproofing electrical interconnects 16 with a mineral layer is implemented by means of an "ALD".

As known per se, ALD is an atomic layer deposition technique comprising successively exposing a surface placed in a chamber, or "reaction chamber", to different chemical precursors, to obtain ultra-thin layers. The deposition of an atomic layer usually occurs in 4 steps:
  a) injecting into the chamber a first gaseous precursor causing the forming on the surface of a monolayer made of chemisorbed species and of other physisorbed species;
  b) purging the reaction chamber, for example, by means of a sweeping with ultra pure nitrogen to remove any species which has not reacted as well as possible reaction byproducts;
  c) injecting into the chamber a second gaseous precursor causing the forming of the layer of desired material on the surface;
  d) purging the chamber to remove species which have not reacted and possible reaction byproducts. Conventionally, a pumping of the chamber is carried out during the injection of precursors to cause a flow thereof in the chamber.

Advantageously, device 30 is placed in the chamber, particularly on a support 32, and the precursor injection is performed with no pumping, so that device 30 is bathed in the precursors, which integrally diffuse in volume 20 between components 10a, 10b without causing a gas disturbance. A layer 34 deposited over the entire exposed surface of device 30, and thus on interconnects 16, is thus obtained (FIG. 6).

The layer of mineral material deposited by ALD is advantageously an electrically insulating layer, particularly a layer of a material of formula $TiO_2$, $ZrO_2$, $SiO_x$, $SiN_x$, $SiO_xN_y$, ZnSe, ZnO, $Sb_2O_3$, aluminum oxides (e.g. $Al_2O_3$), and transparent conductive oxides (or "TCO", e.g. indium-tin oxide ("ITO") or aluminum zinc oxide ("AZO")), particularly having a thickness in the range from 10 nanometers to 100 nanometers. A layer having a permeability to water vapor smaller than or equal to $10^{-3}$ g/m$^2$/day is thus obtained.

Advantageously, a layer of $Al_2O_3$, de $TiO_2$ or of $ZrO_2$ is deposited. These materials, in addition to their waterproofing property, have a good wettability with resins currently used for the filling, and thus help the resin progress by capillarity.

In a first variation, layer 34 is made of a single material.

In a second variation, layer 34 is a multilayer of different mineral materials, called nanolaminated, which enables to combine different permeability properties, or to obstruct gas diffusion paths in a layer by depositing a layer of different material. Advantageously, layer 34 is an $Al_2O_3/TiO_2$ bilayer or an $Al_2O_3/ZrO_2$ bilayer. A bilayer especially enables to passivate the layer in contact with the interconnects (e.g. $Al_2O_3$) with a humidity-stable material.

Due to the insulating character of watertight layer 34, connection areas 22 of the device are not accessible to an electric connection, particularly by wire bonding. The method thus carries on with the exposing of at least one of connection areas 22, advantageously by implementing an isotropic etching, with a direction normal to the main plane of the device, such as illustrated by the arrows of FIG. 7. Such an isotropic etching results in removing the portions of watertight layers on the upper surface of second component 10b and the portions of watertight layer 34 of first component 10a which are not opposite second component 10b, and accordingly the portions of layer 34 covering connection areas 22. The isotropic etching is for example an ion machining (bombarding with unidirectional ions), an isotropic plasma etching, etc. In case of need, the lateral edges 36 of the device are also exposed, for example, by inclining device 30 during the isotropic etching, while avoiding for the etching to reach interconnects 16.

Figure 3:
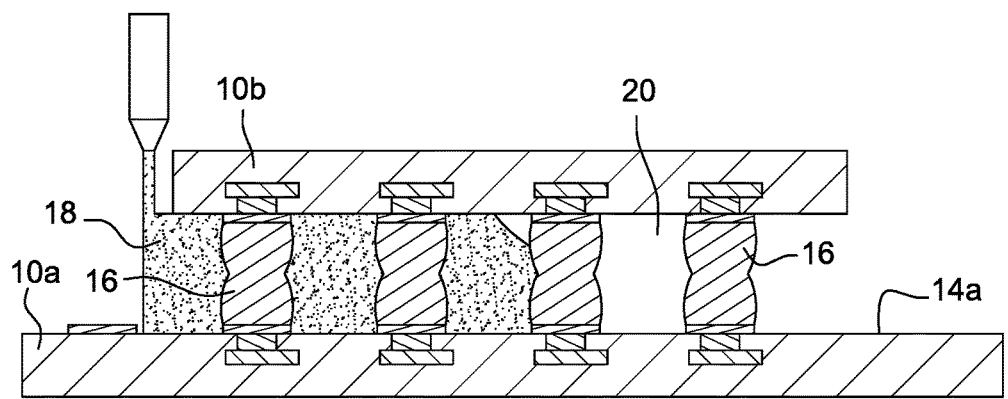
Figure 4:
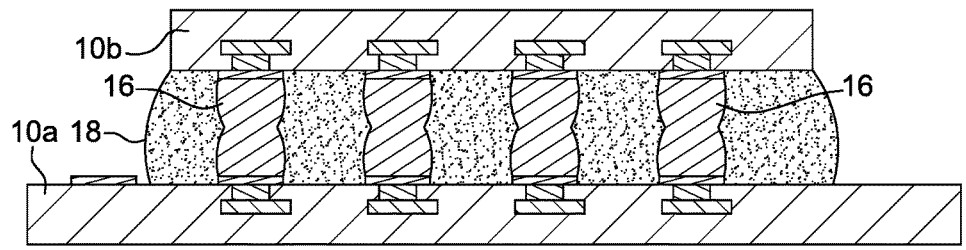
Figure 5:
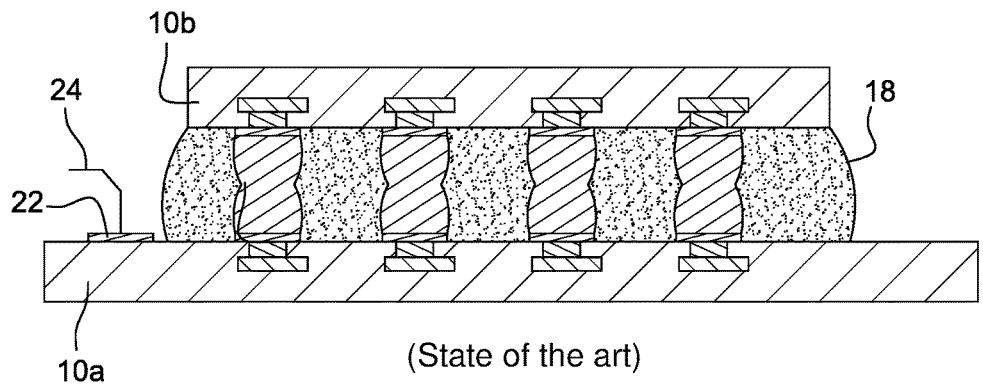

Once interconnects 16 have been waterproofed, the manufacturing method carries on conventionally with the filling of volume 20 between components with resin 18 and the connection of areas 22, for example, as described in relation with FIGS. 3 to 5. A hybridized device having its interconnects encapsulated with a watertight layer 34 and having its volume 20 between electronic components 10a and 10b filled with resin 18 is thus obtained (FIG. 8).

As a numerical example, the waterproofing method has been tested on the display of a projector comprising an array of 1746×1000 pixels (and thus as many interconnects) with a 10-micrometer pitch, hybridized on a CMOS control array provided with microtubes coated with a gold layer and respectively inserted into the indium balls of the pixel array, the interconnects being thus formed of microtubes inserted into balls. The size of the active array thus is 17.46 mm by 10 mm and the pixel array is spaced apart from the control array by a 5-micrometer distance. Such a hybridization is for example described in documents WO 2009/115686 and U.S. 2011/0094789. Due to the invention, a 25-nanometer layer of $Al_2O_3$ has been deposited by ALD on each of the interconnects, the method ending with an underfilling by capillarity by means of a resin, for example, "Epotek 353ND"© of Epoxy Technology Inc., USA.

In light of the foregoing, it should be understood that the invention applies to any type of "flip-chip" hybridization (thermocompression of balls, insertion of male elements into female elements, insertion of solid or hollow elements into balls of lower ductility, insertion at room temperature or not, etc.).

Similarly, the invention applies to any device comprising two opposite components connected by interconnects, be they electrical or not, whether the device has been obtained by "flip-chip" hybridization or not.

Similarly, although a final underfilling step has been described, the invention also encompasses devices which are not provided with such an encapsulation.

The invention claimed is:

1. A method of protecting against humidity by providing a device comprising a first and a second electronic components respectively having two opposite surfaces, said surfaces:
   being separated by a non-zero distance shorter than 10 micrometers;
   having an area greater than 100 mm$^2$;
   being connected by an assembly of electrical interconnection elements spaced apart from one another by a space void of matter,
the method further comprising applying a deposit of thin atomic layers onto the device to form a layer of mineral material covering at least said interconnection elements, the layer of mineral material having a permeability to water vapor smaller than or equal to $10^{-3}$ g/m$^2$/day.

2. The method of claim 1, wherein the mineral material is selected from the group consisting of the compounds of formula TiO$_2$, ZrO$_2$, SiO$_x$, SiN$_x$, SiO$_x$N$_y$, ZnSe, ZnO, Sb$_2$O$_3$, aluminum oxides, and transparent conductive oxides (TCO).

3. The method of claim 1, wherein the layer of mineral material has a thickness in the range from 10 nanometers to 100 nanometers.

4. The method of claim 1:
   wherein the application of the deposit of thin atomic layers comprises placing the structure in a chamber and injecting into said chamber reactant gases for the forming of the layer of mineral material;
   and wherein the injection of the reactant gases is carried out without pumping in the chamber.

5. The method of claim 1, comprising depositing a filling material totally filling the space void of matter separating the opposite surfaces of the two components, the deposition of the filling material being carried out after the deposition of the layer of mineral material on the interconnection elements.

6. A device comprising a first and a second electronic components respectively having two opposite surfaces, said surfaces:
   being separated by a non-zero distance shorter than 10 micrometers;
   having an area greater than 100 mm$^2$;
   being connected by a set of different electrical interconnection elements, said device comprising a layer of mineral material at least covering said interconnection elements, the layer of mineral material having a permeability to water vapor smaller than or equal to $10^{-3}$ g/m$^2$/day.

7. The device of claim 6, wherein the mineral material is selected from the group consisting of the compounds of formula TiO$_2$, ZrO$_2$, SiO$_x$, SiN$_x$, SiO$_x$N$_y$, ZnSe, ZnO, Sb$_2$O$_3$, aluminum oxides, and transparent conductive oxides (TCO).

8. The device of claim 6, wherein the layer of mineral material has a thickness in the range from 10 nanometers to 100 nanometers.

9. The device of claim 6 comprising a filling material totally filling the space separating the opposite surfaces of the two components.

* * * * *